(12) United States Patent
Tong et al.

(10) Patent No.: US 7,935,632 B2
(45) Date of Patent: May 3, 2011

(54) REDUCED METAL PIPE FORMATION IN METAL SILICIDE CONTACTS

(75) Inventors: Wei Hua Tong, Singapore (SG); Lap Chan, Singapore (SG); K. Suresh Kumar, Singapore (SG); Miow Chin Tan, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 621 days.

(21) Appl. No.: 11/935,415

(22) Filed: Nov. 6, 2007

(65) Prior Publication Data

US 2009/0114997 A1    May 7, 2009

(51) Int. Cl.
*H01L 21/44* (2006.01)
(52) U.S. Cl. .......................... 438/682; 438/686
(58) Field of Classification Search .......... None
See application file for complete search history.

(56) References Cited

U.S. PATENT DOCUMENTS

| 5,668,027 | A | 9/1997 | Hashimoto |
| 6,156,654 | A * | 12/2000 | Ho et al. ............. 438/683 |
| 6,249,026 | B1 | 6/2001 | Matsumoto et al. |
| 6,507,123 | B1 | 1/2003 | Woo et al. |
| 6,534,871 | B2 | 3/2003 | Maa et al. |
| 2006/0237766 | A1 * | 10/2006 | Ahn ........................ 257/314 |
| 2007/0049014 | A1 | 3/2007 | Chen et al. |

OTHER PUBLICATIONS

D.S. Yaney et al., The use of thin epitaxial silicon layers for MOS VLSI, Electron Devices Meeting, 1981 International, vol. 27, Issue, 1981 pp. 236-239.

* cited by examiner

*Primary Examiner* — Scott B Geyer
(74) *Attorney, Agent, or Firm* — Horizon IP Pte Ltd

(57) ABSTRACT

Formation of metal pipes resulting from formation of metal silicide contacts are reduced or avoided. To reduce formation of metal pipes, an epitaxial layer is formed over the diffusion region on which the metal silicide contact is formed. The epitaxial layer reduces defects which enhances diffusion of metal atoms or molecules.

21 Claims, 10 Drawing Sheets

REDUCED METAL PIPE FORMATION IN METAL SILICIDE CONTACTS

FIELD OF THE INVENTION

The present invention relates to fabrication of semiconductor devices, and more particularly, to reducing formation of metal silicide bridging.

DESCRIPTION OF THE RELATED ART

Transistors are commonly used in the integrated circuits. FIG. 1a shows a conventional n-type metal oxide semiconductor (MOS) transistor 110 formed on an active region of a substrate 105. A p-well 108 is located in active region of the substrate. Shallow trench isolations 180 are used to isolate the active region from other device regions. The transistor has source/drain diffusion regions 125a-b adjacent to a gate 130, which includes a gate electrode 131 over gate dielectric layer 132. Located on the gate sidewalls are dielectric sidewall spacers 160. Metal silicide contacts 140 and 141 are provided on the surface of the substrate in the source/drain regions and gate electrodes.

Nickel silicide or nickel alloy silicides have been extensively used as contacts due to low sheet resistance properties. Ni atoms, however, are highly diffusive. During processing, Ni atoms diffuse beneath the spacers, causing formation of Ni pipes 148. FIG. 1b shows a TEM image of transistors. As shown, nickel silicide contacts 140 and 141 are disposed adjacent to gate conductors 130 with sidewall spacers 160. Tungsten plugs 165 are provided over the nickel silicide contacts. Nickel pipes 148 exist beneath the spacers. Ni pipes can lead to junction leakage, negatively affecting device performance or functionality.

In view of the foregoing, it is desirable to provide transistors with metal silicide contacts which reduce or minimize formation of metal pipes.

SUMMARY OF THE INVENTION

The present invention relates to fabrication of semiconductor devices. In accordance with one aspect of the invention, a method of fabricating an integrated circuit (IC) is disclosed. The method includes providing a substrate prepared with a transistor having a gate and source/drain diffusion regions adjacent to the gate and forming an epitaxial layer on the substrate over the source/drain diffusion regions. The method further comprises the step of depositing a metal or alloy layer on the substrate covering the source/drain diffusion regions and the substrate is processed to form metal silicide contacts over the source/drain diffusion regions. The epitaxial layer formed reduces formation of metal pipes.

An IC is disclosed in another aspect of the invention. The IC comprises a transistor disposed on a substrate, the transistor includes a gate and source/drain diffusion regions in the substrate adjacent thereto. The IC further comprises metal silicide contacts on the source/drain diffusion regions, wherein the silicide contacts comprise metal or alloy layer reacted with epitaxial layer over the source/drain diffusion regions.

In yet another aspect of the invention, a method of forming metal silicide contacts is presented. The method includes providing a substrate prepared with a diffusion region and forming an epitaxial layer over the diffusion region. The method further comprises depositing a metal or alloy layer over the diffusion region and the substrate is processed to form metal silicide contacts over the diffusion region.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION OF THE INVENTION

In the following description, details are set forth such as specific materials, parameters, etc. in order to provide a thorough understanding of the present invention. It will be evident, however, that the present invention may be practised without these details. In other instances, well-known process steps, equipment, etc. have not been described in particular detail so as not to obscure the present invention.

The present invention relates to transistors with metal silicide contacts. The transistors can be incorporated into ICs. The ICs can be any type of IC, for example dynamic or static random access memories, signal processors, or system on chip devices, mixed signal or analog devices such as A/D converters and switched capacitor filters. Other types of ICs are also useful. Such ICs are incorporated in, for example, communication systems and various types of consumer products.

Figure 1A:
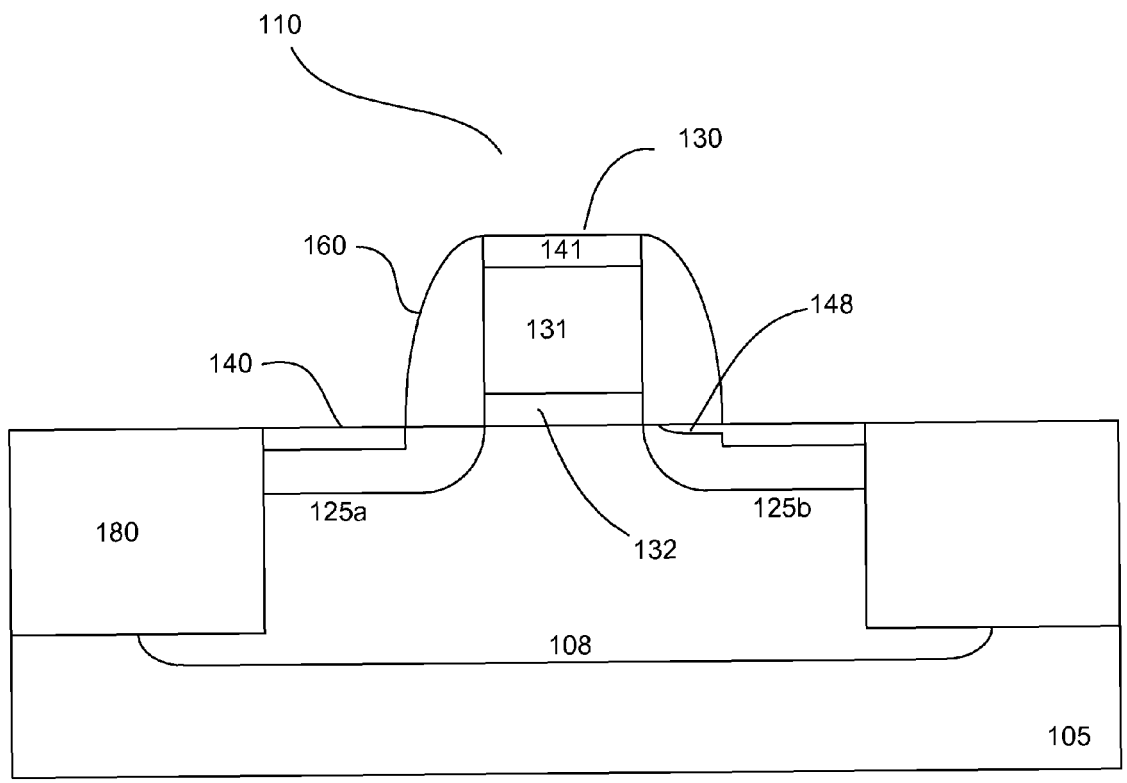
FIGS. 1a-b show a conventional transistor with metal pipes.
Figure 1B:
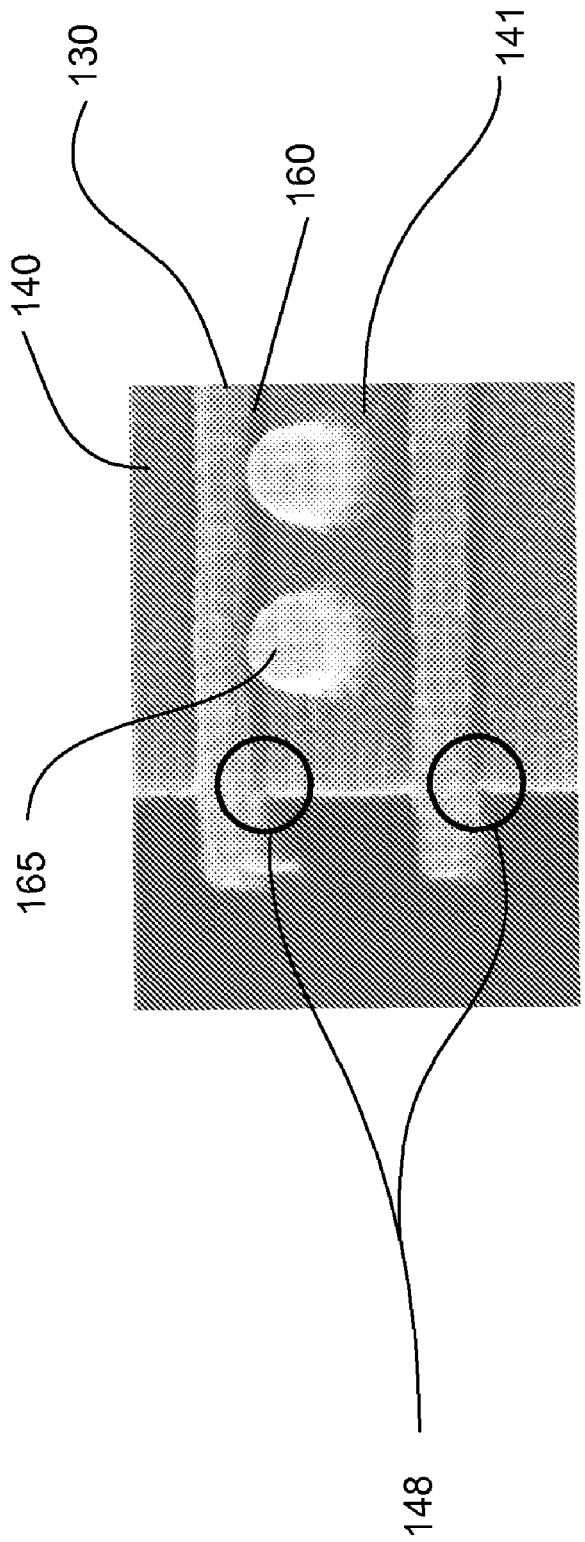
Figure 2:
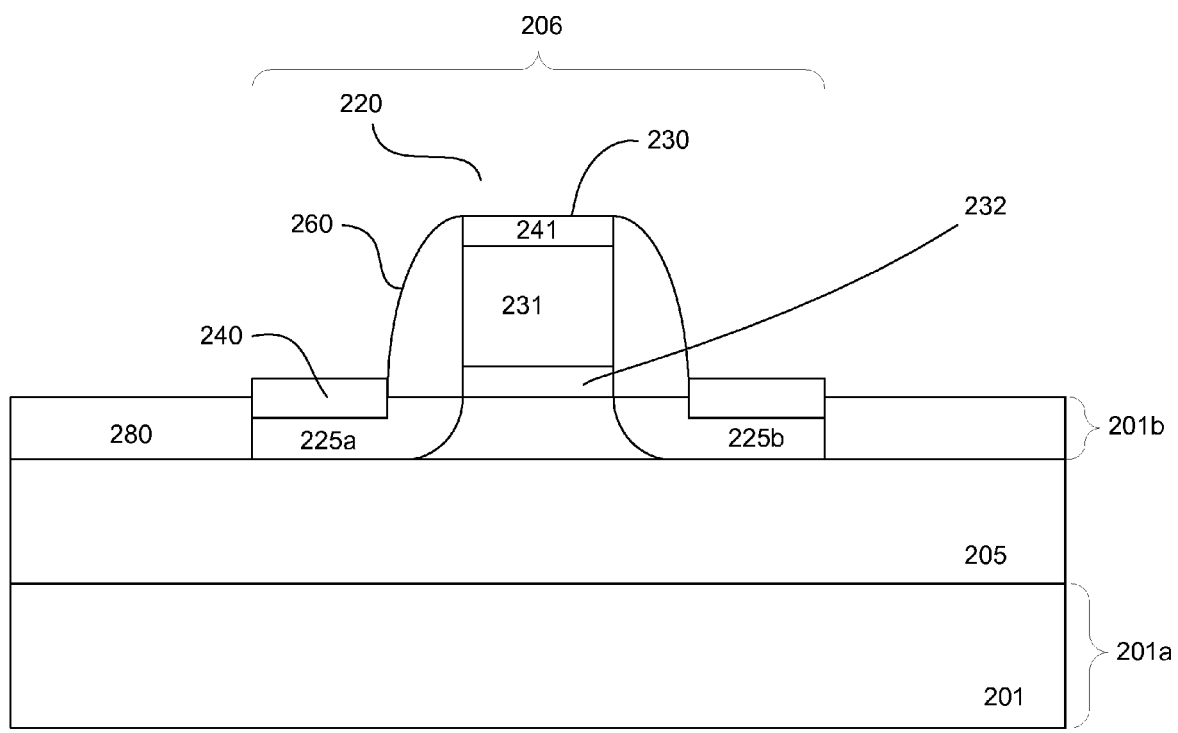
FIG. 2 shows a transistor in accordance with one embodiment of the invention.

FIG. 2 shows a transistor 220 in accordance with one embodiment of the invention. The transistor is formed in an active region 206 in the substrate 201. In one embodiment, the substrate comprises a silicon on insulator (SOI) substrate. Other types of substrates, such as silicon or silicon germanium, are also useful. The SOI substrate comprises an insulator or buried oxide layer 205 between top silicon layer 201b and bulk silicon 201a. The active region is isolated from other device regions by isolation regions 280. The isolation regions, for example, comprise shallow trench isolations (STIs). The bottom of the STIs preferably extends below the top surface of the buried oxide layer.

The active region is heavily doped with dopants of a second polarity type. The transistor comprises a gate 230 on the substrate. The gate includes a gate electrode 231 over a gate dielectric 232. Typically, the gate electrode is formed from polysilicon and the gate dielectric is formed from thermal oxide. Other types of materials are also useful. Source/drain diffusion regions 225a-b are located adjacent to the gate beneath the substrate surface. The source/drain diffusion regions are heavily doped with dopants of a first polarity type. The first polarity type, for example, comprises n-type, forming a n-type transistor. Forming p-type transistors with p-type dapants as the first polarity type is also useful. Dielectric spacers 260 are disposed on the gate sidewalls. The dielectric spacers, for example, are formed from silicon oxide. Other types of dielectric materials, such as silicon nitride, are also useful.

Contacts 240 and 241 are provided over the diffusion regions and gate electrode. In one embodiment, the contacts comprise metal silicide. Preferably, the metal silicide comprises nickel or a nickel alloy, such as nickel-platinum or nickel tantalum. Other types of metal silicides can also be useful. In accordance with one embodiment of the invention, the metal silicide contacts are derived by processing a metal layer with an epitaxial silicon (epi) layer on the surface of the substrate over the diffusion regions. The epi layers, for example, can be provided on the surface of the diffusion regions selectively. Other techniques for providing epi layers are also useful. Preferably, the epi layers are fully consumed by the metal layer during processing to form the metal silicide contacts. For example, the thickness of the epi layer is about 200 Å for a typical nickel layer of about 100 Å. Other thickness is also useful. By providing an epi layer on the surface of the diffusion regions, formation of nickel pipes are reduced or minimized.

Figure 3A:
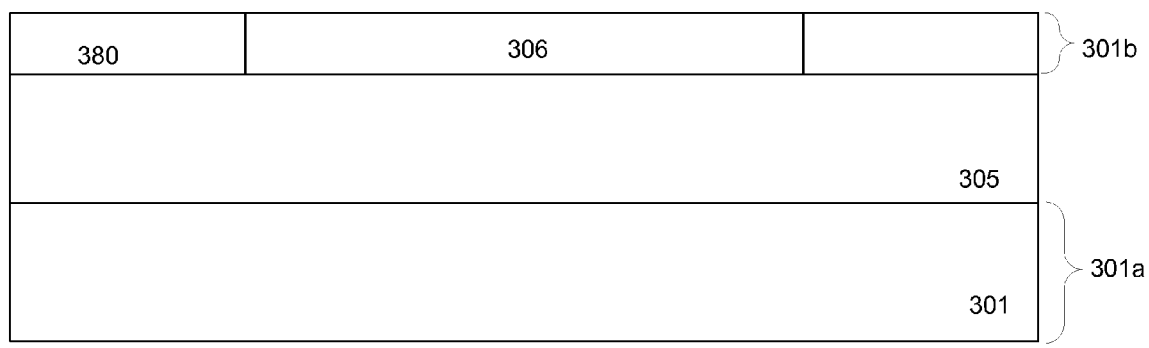
FIGS. 3a-g show a process for forming a transistor in accordance with one embodiment of the invention.

FIGS. 3a-g show a process for forming a transistor in accordance with one embodiment of the invention. Referring to FIG. 3a, a semiconductor substrate 301 is provided. The substrate, in one embodiment, comprises a SOI substrate. Other types of substrates, such as a p-type silicon substrate, may also be useful. The SOI substrate includes a buried oxide layer 305 below the surface of the substrate. This results in a top silicon layer 301b and bulk silicon 301a sandwiching the buried oxide layer. Typically, the top silicon layer is from a few hundred to a few thousand angstroms thick while the buried oxide is about a few thousand angstroms thick. Other thicknesses for the top silicon and buried oxide layers are also useful. The substrate is prepared with an active region 306. The active region comprises a heavily doped region with dopants of second polarity type. To form the active region, conventional ion implantation techniques, such as implantation with a mask can be used. Other techniques for forming the active region are also useful.

Isolating the active regions from other device regions on the substrate are isolation regions 380. The isolation regions, for example, comprise STI regions. In one embodiment, the STI regions extend below the top surface of the buried oxide layer. Various conventional processes can be employed to form the STI regions. For example, the substrate can be etched using conventional etch and mask techniques to form trenches which are then filled with dielectric material such as silicon oxide. Chemical mechanical polishing (CMP) can be performed to remove excess oxide and provide a planar substrate top surface. The STI regions can be formed, for example, prior to or after the formation of the doped wells.

Figure 3B:
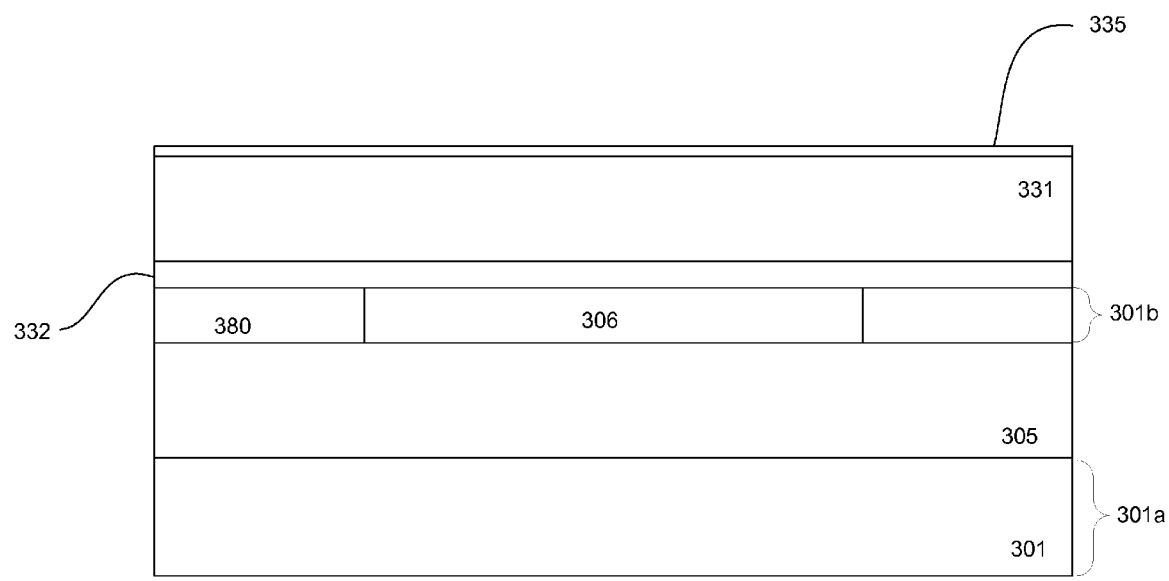

Referring to FIG. 3b, the process continues to form the gate layers on the substrate. For example, forming the gate layers comprises sequentially forming a gate dielectric layer 332 and a gate electrode layer 331 on the substrate surface. In one embodiment, the gate dielectric layer comprises thermal oxide. Other types of gate dielectrics are also useful. The gate electrode layer, for example, comprises polysilicon. Other types of gate electrode materials, such as metal, are also useful. The gate layer, in one embodiment, can comprise a heavily doped polysilicon layer of the first polarity type. The polysilicon can be in-situ doped or doped by ion implantation after deposition, such as during formation of the source/drain diffusion regions. Providing undoped polysilicon is also useful.

In one embodiment of the invention, a buffer layer 335 is formed over the gate electrode layer. The purpose of the buffer layer is to prevent the formation of an epi layer over the gate electrode during a subsequent selective epi process. The buffer layer, for example, comprises nitride. Other types of buffer materials, such as oxide, are also useful. Preferably, the buffer material comprises a material different from the spacer material of the gate.

Figure 3C:
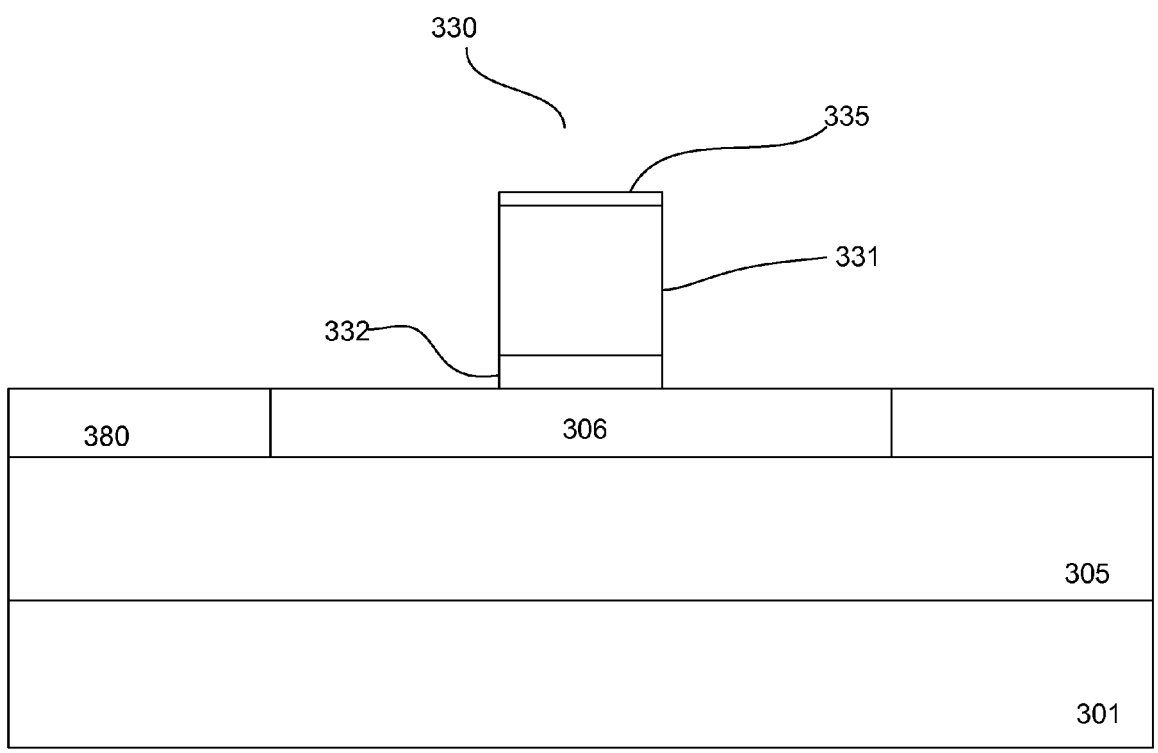
Figure 3D:
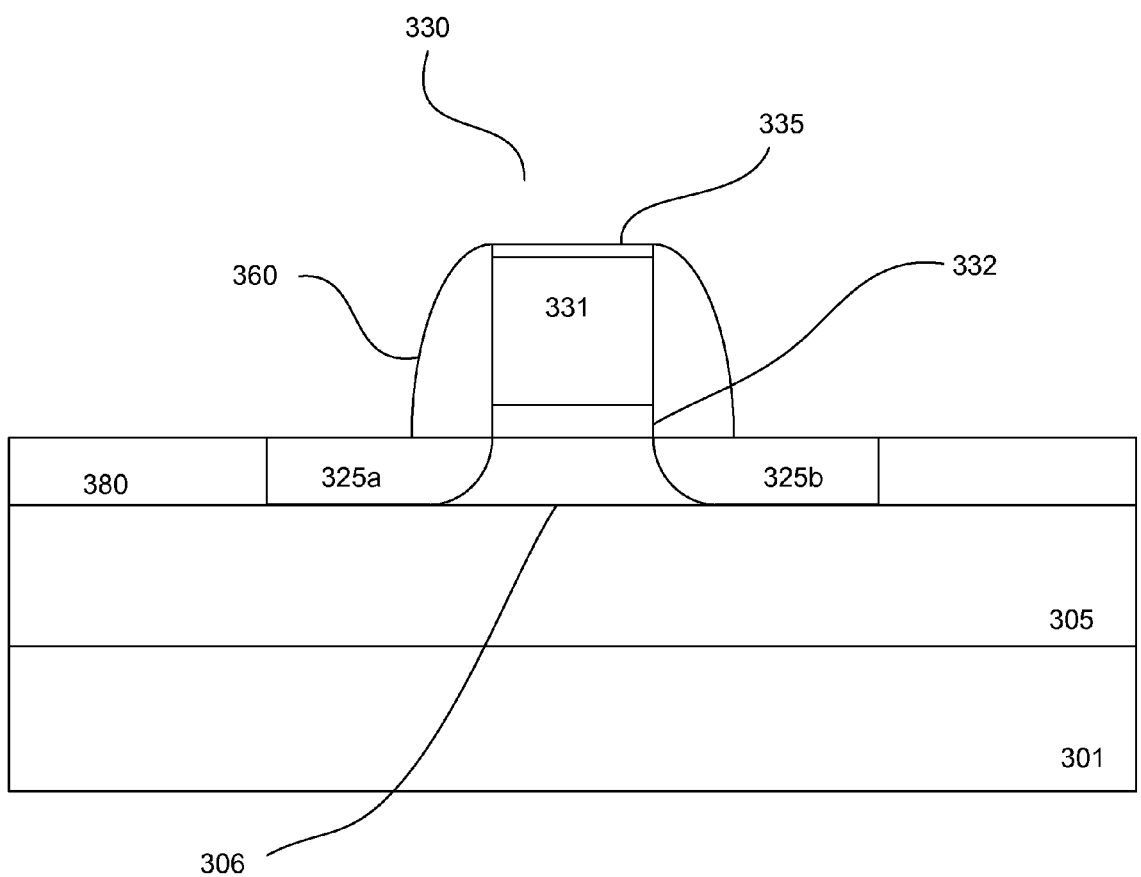

Referring to FIG. 3c, the layers are then patterned using conventional mask and etch techniques to form a gate 330. Spacers 360 are formed on the gate sidewalls, as shown in FIG. 3d. The spacers comprise, for example, a dielectric material such as oxide and/or nitride. In one embodiment, the spacers comprise silicon oxide. The spacers can be formed using conventional spacer processes, such as depositing a blanket dielectric layer on the substrate and gate. The dielectric layer is then patterned to remove the horizontal portions, leaving the spacers on sidewalls of the gate.

Source/drain diffusion regions 325a-b are formed in the active region of the substrate adjacent to the gate. The diffusion regions, for example, comprise heavily doped regions of the first polarity type. The doped regions can be formed by ion implantation. The implant can be self-aligned or formed using an implant mask. Other techniques for forming the diffusion regions are also useful.

In one embodiment, the diffusion regions comprise lightly doped (LDD) and heavily doped (HDD) regions via, for example, a two step ion implantation process. For example, the LDD regions are formed after the gate is patterned and the HDD regions are formed after spacer formation. After the formation of diffusion regions, the dopants are activated by, for example, a thermal annealing process. The anneal also serves to facilitate recovery from any deformation to the crystal structure incurred during the process of ion implantation. Typically, the anneal is carried out at about 1050-1100° C. In the case of a soak or spike anneal, a flash or laser anneal is performed thereafter at about 1200-1300° C.

Figure 3E:
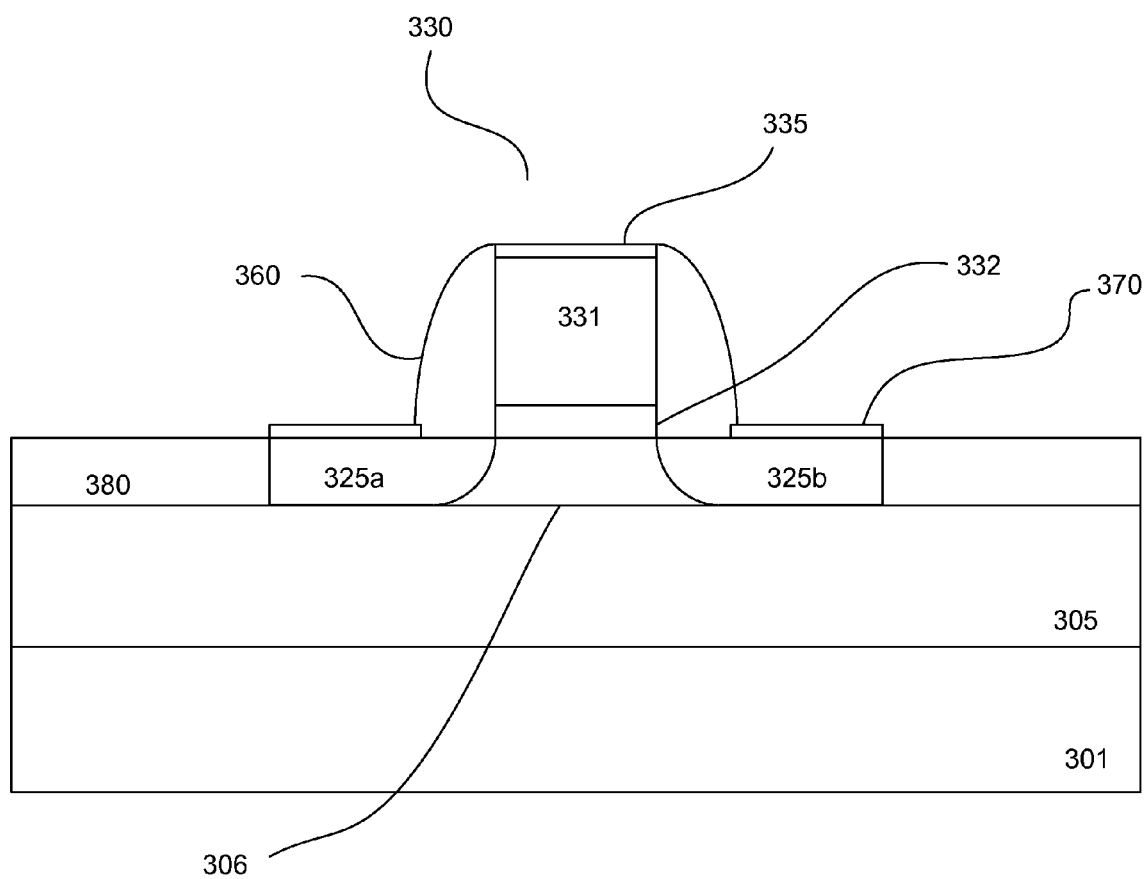

Referring to FIG. 3e, an epi layer 370 is formed on the substrate over the diffusion regions. Prior to forming the epi layer, the surface of the substrate is cleaned by, for example, DHF clean. The DHF clean removes native oxide from the surface of the substrate. The epi layer, for example, is formed by selective deposition techniques. Preferably, the epi is formed by low temperature selective epi deposition techniques. Selective techniques deposit the epi layer only on the silicon surface. This advantageously creates a self-aligned process which avoids a masking and etching to remove unwanted epi. Preferably, the thickness of the epi is selected to ensure being fully consumed during a subsequent process to form metal silicide. The thickness of the epi, for example, is about 200 Å.

Figure 3F:
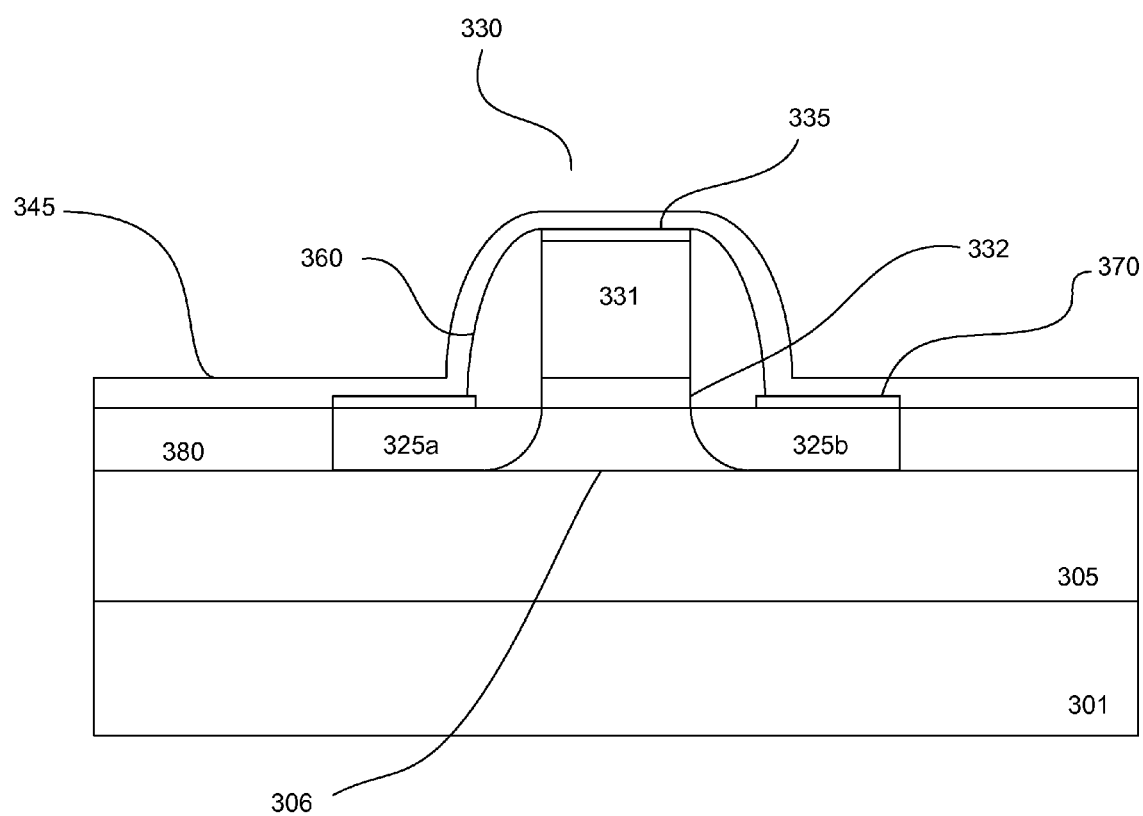

After formation of the epi layer over the diffusion regions, the surface of the substrate is cleaned. For a nitride buffer layer, the cleaning is achieved by, for example, a $H_3PO_4$ clean chemistry. The buffer layer is removed. As shown in FIG. 3f, a metal layer 345 is deposited over the substrate, covering the diffusion regions and gate. Preferably, the metal layer comprises nickel or nickel alloy, such as nickel platinum or nickel tantalum. Other types of materials may also be useful. Typical thickness of the metal layer is about 80-150 Å. A cap layer (not shown) can be formed over the metal layer. The cap layer, for example, comprises titanium nitride (TiN). The cap layer is about, for example, 50 Å thick. Other types of cap layer or thicknesses are also useful.

Figure 3G:
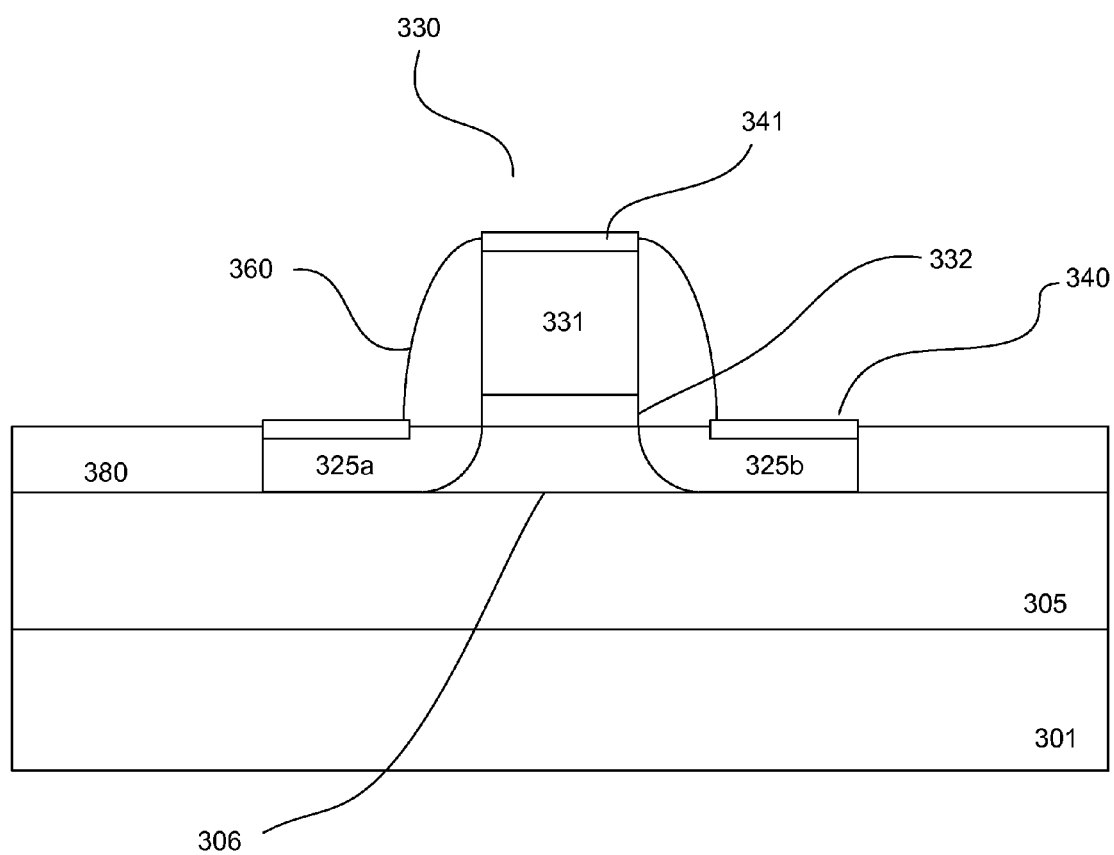

Referring to FIG. 3g, a salicide process is preformed to form metal silicide contacts 340 and 341 over the diffusion regions (325a-b) and the gate electrode (331). In one embodiment, the salidide process forms nickel or nickel alloy silicide contacts. The salicide process, for example, comprises annealing the substrate, causing a reaction between the metal and silicon (e.g., substrate, epi and polysilicon). The parameters of the salicide anneal should be selected to avoid salicide over-growth into the diffusion regions. In one embodiment, the substrate is annealed at a temperature of about 400° C. in a nitrogen ambient for about 5 seconds. Other process parameters may also be useful. The cap layer as well as excess metal layer on the substrate, such as over the STIs and gate sidewalls, are removed. Removal can be achieved using a selective wet etch clean to the metal material, such as nickel or nickel alloy.

In accordance with one embodiment of the invention, the thickness of the epi and metal layers are selected to ensure full consumption of the epi during the salicide process with the desired amount of silicidation. For example, about 100 Å of Ni or NiPt reacts with about 200 Å of epi silicon to form about 200 Å of nickel silicide. The actual amount of silicidation depends on design requirements.

The process continues by forming interconnections to the contacts of the transistors. For example, a dielectric is deposited and patterned to create vias and trenches, which are then filled with conductive material, such as copper, to form interconnects. Additional processes are performed to complete the IC, for example, additional interconnect levels, final passivation, dicing, and packaging.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of fabricating an integrated circuit (IC) comprising:
   providing a substrate prepared with a transistor having a gate and source/drain diffusion regions adjacent to the gate, wherein the gate comprises a buffer layer on a surface thereof;
   selectively forming an epitaxial layer on the substrate over the source/drain diffusion regions, wherein the buffer layer prevents formation of the epitaxial layer on the gate;
   depositing a metal or metal alloy layer on the substrate covering the source/drain diffusion regions;
   processing the substrate to form metal silicide contacts over the source/drain diffusion regions, wherein the epitaxial layer reduces formation of metal pipes; and
   wherein processing the substrate consumes the epitaxial layer.

2. The method of claim 1 wherein processing the substrate consumes the epitaxial layer.

3. The method of claim 1 wherein depositing the metal or metal alloy layer comprises depositing a nickel metal or nickel alloy layer.

4. The method of claim 3 wherein processing the substrate consumes the epitaxial layer.

5. The method of claim 1 further comprises forming a cap layer over the gate to facilitate selectively forming the epitaxial layer over the source/drain diffusion layers.

6. The method of claim 5 wherein processing the substrate consumes the epitaxial layer.

7. The method of claim 5 wherein depositing the metal or metal alloy layer comprises depositing a nickel metal or nickel alloy layer.

8. The method of claim 7 wherein processing the substrate consumes the epitaxial layer.

9. The method of claim 1 wherein the gate comprises dielectric spacer on gate sidewalls and wherein:
   forming a cap layer over the gate to facilitate selectively forming the epitaxial layer over the source/drain diffusion regions; and
   processing the substrate consumes the epitaxial layer.

10. The method of claim 9 wherein depositing the metal or metal alloy layer comprises depositing a nickel metal or nickel alloy layer.

11. The method of claim 1 further comprising removing the protection layer and forming metal silicide contacts over the source/drain regions and on top of the gate.

12. A method of forming metal silicide contacts comprising:
   providing a substrate prepared with a diffusion region;
   forming an epitaxial layer over the diffusion region only;
   depositing a metal or metal alloy layer over the diffusion region;
   processing the substrate to form metal silicide contacts over the diffusion region; and
   wherein processing the substrate consumes the epitaxial layer.

13. The method of claim 12 wherein depositing the metal or metal alloy layer comprises depositing a nickel metal or nickel alloy layer.

14. The method of claim 12 wherein depositing the metal or metal alloy layer comprises depositing a nickel metal or nickel alloy layer.

15. A method of fabricating an IC comprising:
   providing a substrate prepared with a transistor having a gate and source/drain diffusion regions adjacent to the gate, wherein the gate comprises a buffer layer on a surface thereof;
   selectively forming an epitaxial layer on the substrate over the source/drain diffusion regions, wherein the buffer layer prevents formation of the epitaxial layer on the gate;
   depositing a metal or metal alloy layer on the substrate covering the source/drain diffusion regions;
   processing the substrate to form metal silicide contacts over the source/drain diffusion regions; and
   wherein processing the substrate consumes the epitaxial layer.

16. The method of claim 15 wherein processing the substrate consumes the epitaxial layer.

17. The method of claim 15 wherein the metal or alloy layer comprises a nickel metal or nickel alloy layer.

18. The method of claim 17 wherein processing the substrate consumes the epitaxial layer.

19. The method of claim 15 wherein the gate comprises sidewall spacers and wherein processing the substrate consumes the epitaxial layer.

20. A method of fabricating an IC comprising:
   providing a substrate prepared with a transistor having a gate and source/drain diffusion regions adjacent to the gate, wherein the gate comprises a buffer layer on a surface thereof;
   selectively forming an epitaxial layer on the substrate over the source/drain diffusion regions, wherein the buffer layer prevents formation of the epitaxial layer on the gate;
   depositing a metal or metal alloy layer on the substrate covering the source/drain diffusion regions; and
   processing the substrate to form metal silicide contacts over the source/drain diffusion regions, wherein the epitaxial layer reduces formation of metal pipes, and wherein processing the substrate consumes the epitaxial layer.

21. A method of forming a device comprising:
providing a substrate prepared with a transistor having a gate and source/drain diffusion regions adjacent to the gate;
forming an epitaxial layer on the substrate over the source/drain diffusion regions;
depositing a metal or metal alloy layer on the substrate covering the source/drain diffusion regions; and
processing the substrate to form metal silicide contacts over the source/drain diffusion regions, wherein the epitaxial layer is fully consumed by processing to form the silicide contacts to reduce formation of metal pipes.

* * * * *